(12) United States Patent
Sirard et al.

(10) Patent No.: US 8,898,928 B2
(45) Date of Patent: Dec. 2, 2014

(54) DELAMINATION DRYING APPARATUS AND METHOD

(71) Applicant: Lam Research Corporation, Fremont, CA (US)

(72) Inventors: Stephen M. Sirard, Austin, TX (US); Diane Hymes, San Jose, CA (US); Alan M. Schoepp, Ben Lemond, CA (US); Ratchana Limary, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 190 days.

(21) Appl. No.: 13/650,044

(22) Filed: Oct. 11, 2012

(65) Prior Publication Data

US 2014/0101964 A1 Apr. 17, 2014

(51) Int. Cl.
*F26B 13/30* (2006.01)

(52) U.S. Cl.
USPC ........ 34/284; 34/381; 34/78; 34/90; 118/728; 165/103; 427/587; 62/3.2

(58) Field of Classification Search
USPC ............. 34/284, 380, 381, 413, 427, 497, 77, 34/78, 80, 90, 92; 118/725, 728; 165/80.4, 165/103; 427/248.1, 585, 587; 62/3.2
See application file for complete search history.

(56) References Cited

U.S. PATENT DOCUMENTS

| | | | | |
|---|---|---|---|---|
| 4,771,730 A | * | 9/1988 | Tezuka | 118/723 E |
| 5,173,766 A | * | 12/1992 | Long et al. | 257/687 |
| 5,264,246 A | * | 11/1993 | Ikeno | 427/240 |
| 5,835,334 A | | 11/1998 | McMillin et al. | |
| 7,331,097 B2 | * | 2/2008 | Stone et al. | 29/458 |
| 7,604,852 B2 | * | 10/2009 | Oya | 428/1.2 |
| 8,029,893 B2 | * | 10/2011 | Siegel et al. | 428/341 |
| 8,298,340 B2 | * | 10/2012 | Fukao et al. | 118/729 |
| 8,691,147 B2 | * | 4/2014 | Leck et al. | 422/63 |
| 2003/0172874 A1 | * | 9/2003 | Kawaguchi | 118/728 |
| 2004/0177917 A1 | * | 9/2004 | Adachi | 156/230 |
| 2006/0137212 A1 | * | 6/2006 | Nomine | 34/284 |
| 2011/0226179 A1 | * | 9/2011 | Postupack et al. | 118/620 |
| 2012/0231166 A1 | * | 9/2012 | Fukao et al. | 427/255.23 |
| 2012/0247504 A1 | * | 10/2012 | Nasr et al. | 134/1.1 |
| 2012/0304483 A1 | * | 12/2012 | Sirard et al. | 34/289 |
| 2013/0256285 A1 | * | 10/2013 | Baxter et al. | 219/121.72 |
| 2014/0101964 A1 | * | 4/2014 | Sirard et al. | 34/284 |

FOREIGN PATENT DOCUMENTS

| | | | | |
|---|---|---|---|---|
| CA | 1336057 C | * | 6/1995 | |
| EP | 0609088 | * | 8/1994 | |
| GB | 1424263 A | * | 4/1977 | |
| JP | 06224116 A | * | 8/1994 | H01L 21/027 |
| WO | WO 2007043755 A1 | * | 4/2007 | H01L 21/00 |

OTHER PUBLICATIONS

International Patent Application No. PCT/US2012/039855 filed on May 29, 2012.

* cited by examiner

*Primary Examiner* — Steve M Gravini
(74) *Attorney, Agent, or Firm* — Beyer Law Group LLP

(57) ABSTRACT

An apparatus for delamination drying a substrate is provided. A chamber for receiving a substrate is provided. A chuck supports and clamps the substrate within the chamber. A temperature controller controls the temperature of the substrate and is able to cool the substrate. A vacuum pump is in fluid connection with the chamber. A tilting mechanism is able to tilt the chuck at least 90 degrees.

19 Claims, 5 Drawing Sheets

DELAMINATION DRYING APPARATUS AND METHOD

BACKGROUND OF THE INVENTION

The present invention relates to the formation of semiconductor devices. More specifically, the invention relates to an apparatus or method for removing liquids from a substrate during the formation of semiconductor devices.

During semiconductor wafer processing, wet processing requires the subsequent removal of liquid from semiconductor devices.

As semiconductor devices continue to scale down to smaller sizes, higher aspect ratio structures are required to achieve the desired device performance. The fabrication of microelectronic/semiconductor devices requires a repetitive flow of multiple processing steps such as, material deposition, planarization, feature patterning, feature etching, and feature cleaning. The drive towards higher aspect ratio structures creates processing challenges for many of these traditional fabrication steps. Wet processes such as etch and clean, which typically make up greater than ~25% of the process flow, are particularly challenging on high aspect ratio features due to the capillary forces that are generated during drying. The strength of these capillary forces are dependent on the surface tension and contact angle of the etch, clean, or rinse fluids that are being dried, as well as the feature spacing and aspect ratio. If the forces generated during drying are too high, then the high aspect ratio features will collapse onto each other and stiction may occur. Feature collapse and stiction will severely degrade the device yield.

In addition, the formation of capacitors may also provide structures that are subject to collapse during drying.

SUMMARY OF THE INVENTION

To achieve the foregoing and in accordance with the purpose of the present invention, an apparatus for delamination drying a substrate is provided. A chamber for receiving a substrate is provided. A chuck supports and clamps the substrate within the chamber. A temperature controller controls the temperature of the substrate and is able to cool the substrate. A vacuum pump is in fluid connection with the chamber. A tilting mechanism is able to tilt the chuck at least 90 degrees.

In another manifestation of the invention, a method is provided. A substrate, which is wet with a drying chemistry, is placed on a chuck in a drying chamber. The drying chemistry is frozen to a solid drying chemistry on the substrate. The solid drying chemistry is delaminated from the substrate. The delaminated solid drying chemistry is removed from the substrate.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the current and prior art, alternative rinsing liquids with lower surface tension than deionized water have been implemented to prevent feature collapse. While this method has been successful for lower aspect ratio structures, it suffers the same collapse and stiction issues as deionized water at higher aspect ratios and smaller feature spacing. This failing is due to the fact that these lower surface tension fluids still possess a finite surface tension that generates forces during drying that are too strong for the fragile features. An alternative method to dry high aspect ratio structures is to dissolve and flush the rinsing fluid with a supercritical fluid. Supercritical fluids should generally be free of surface tension and thus eliminate the capillary forces that result in feature collapse. Despite the advantages of supercritical fluids, there are several technical and manufacturing challenges in implementing these fluids. These challenges include high equipment and safety costs, long process times, variable solvent quality during the process, extreme process sensitivity due to the diffuse and tunable nature of the fluid, and wafer defectivity/contamination issues arising from the interaction of the fluid with the chamber parts. Another strategy for preventing collapse of high aspect ratio structures is to add a mechanical bracing structure that supports the features. There are several tradeoffs with this approach including higher cost and process complexity that negatively impact throughput and yield. Furthermore, bracing is not a robust solution since it is limited to certain types of structures. Thus, alternative methods and systems for damage-free removal of liquids from semiconductor/microelectronic devices are desirable.

Figure 1:
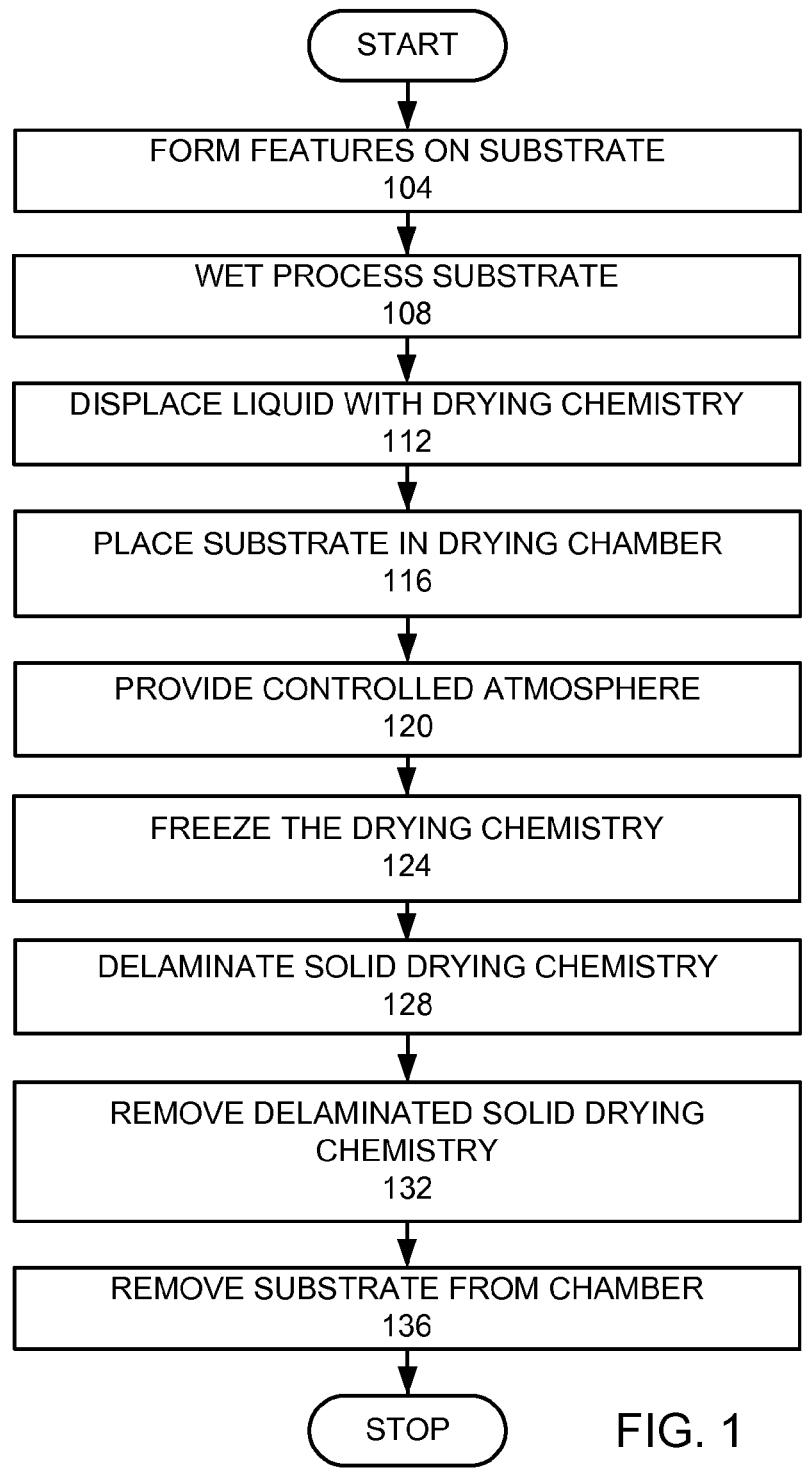
FIG. 1 is a high level flow chart of an embodiment of the invention.

FIG. 1 is a high level flow chart of an embodiment of the invention. In this embodiment, features are formed on a substrate (step 104). The features may be formed by wet or dry etching the features, or by a deposition process for depositing features. The features may have such a high aspect ratio that a subsequent drying process would cause feature collapse. A wet process is used on the substrate (step 108). The wet process may be used to form the features or may be a subsequent process, such as a cleaning after the features are formed. Liquid from the wet process is displaced with a drying chemistry (step 112). In some embodiments, the liquid for the wet process is the same as the drying chemistry; in such a case this step is not needed. The wet substrate is placed in a delamination drying chamber (step 116). The atmosphere of the delamination drying chamber is controlled (step 120). If the drying chemistry is tert-butanol (TBA), then the controlled atmosphere would be moisture free or have reduced water content. The liquid drying chemistry is frozen (step 124). The frozen solid drying chemistry is delaminated from the substrate (step 128). The solid drying chemistry is removed from the substrate (step 132). The substrate is removed from the chamber (step 136).

EXAMPLE

In a specific example of an embodiment of an invention, a patterned substrate is provided with an etch layer. The etch layer is etched forming memory lines with a CD of less than 40 nm and a pitch of less than 80 nm and a height to width aspect ratio of greater than 10:1 (step 104). The substrate is subjected to a wet process, such as the etching or a cleaning process (step 108). In this example, the substrate is cleaned with dilute hydrofluoric acid. The substrate is then rinsed with deionized water. The deionized water is then displaced with a liquid drying chemistry (step 112), which in this example is pure tert-butanol (TBA). The wet substrate is placed in a delamination drying chamber (step 116).

Figure 2A:
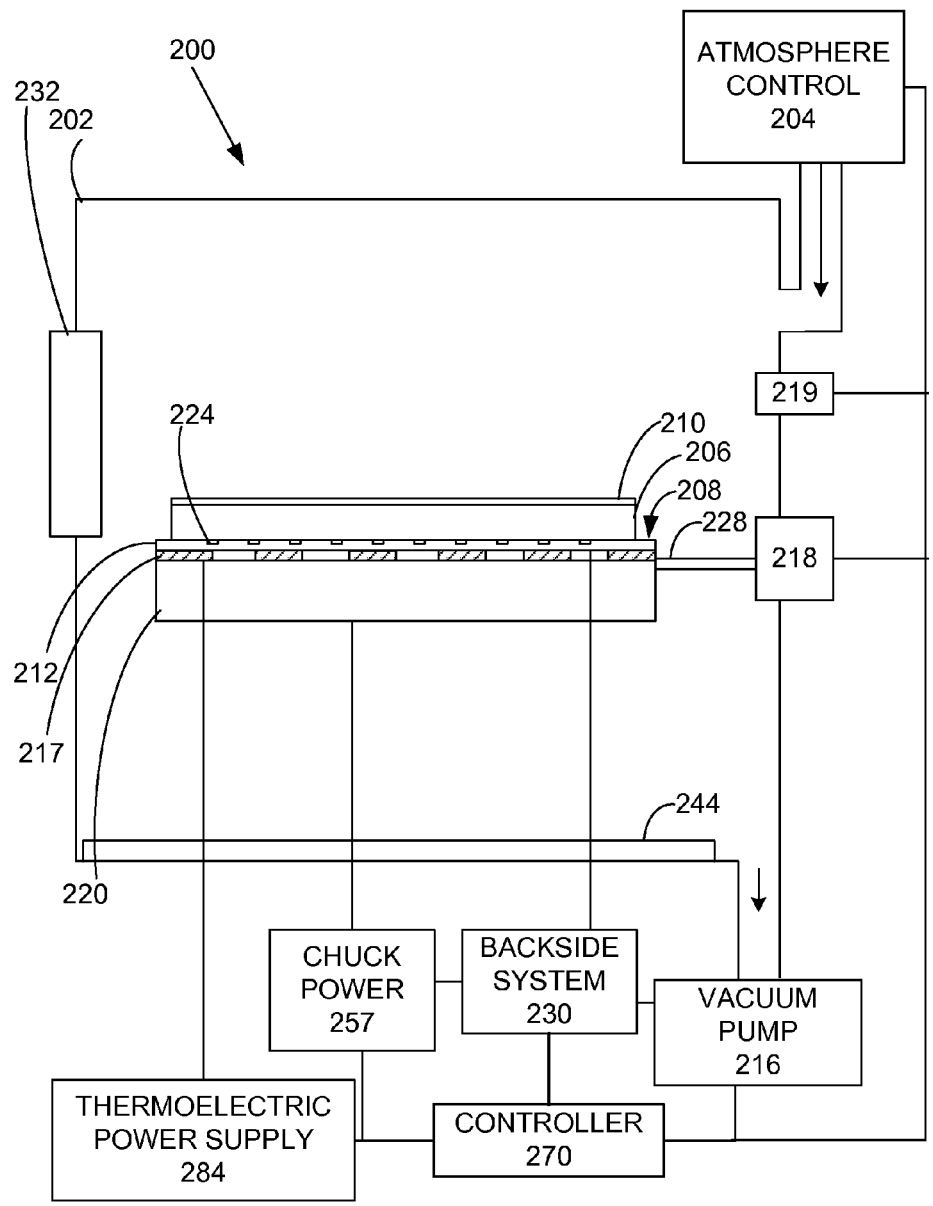
FIGS. 2A-C are schematic illustrations of a delamination drying system in an embodiment of the invention.

FIG. 2A is a schematic view of an example of a delamination drying system 200 that may be used in this embodiment of the invention. An atmosphere control 204 is in fluid connection with a delamination drying chamber 202. The atmosphere control 204 controls the pressure and type of gas in the delamination drying chamber 202. An electrostatic chuck (ESC) 208 is placed in the chamber to support a substrate 206, such as a wafer. The delamination drying system 200 further comprises a wet transfer station 232, which provides a method for transferring the wet substrate 206 into the delamination drying chamber 202 and provides a vacuum seal through which the atmosphere can be controlled and the delamination drying process pressure can be achieved. The delamination drying system further comprises a vacuum pump 216.

In this embodiment the ESC 208 comprises a contact layer 212, a layer of thermoelectric devices 217, and a body 220. A thermoelectric power supply 284 is electrically connected to the layer of thermoelectric devices 217. The thermoelectric power supply 284 provides a voltage to the thermoelectric devices 217. The thermoelectric power supply 284 uses the magnitude and direction of the voltage to determine whether the thermoelectric devices 217 provide a heat differential or cooling differential and the magnitude of such a differential between the ESC body 220 and the contact layer 212. A chuck power supply 257 provides a clamping voltage to electrostatically clamp the substrate 206 onto the ESC 208. A backside cooling and heating system 230 is connect to the ESC 208 and provides a fluid, such as helium, through the ESC 208 to the backside of the substrate 206 to increase heat transfer between the ESC 208 and the substrate 206. The backside cooling/heating system 230 is also connected to the vacuum pump 216 which allows for the substrate to be vacuum clamped to the ESC 208. An example of a backside cooling system is described in U.S. Pat. No. 5,835,334 entitled, "Variable High Temperature Chuck for High Density Plasma Chemical Vapor Deposition," by McMillin et al., which is incorporated by reference for all purposes. A manometer 219 is connected to the delamination drying chamber 202. Grooves 224 are placed on a surface of the ESC 208, between the ESC 208 and the substrate 206. An axel 228 is connected between the ESC 208 and a motor 218.

A controller 270 is controllably connected to the thermoelectric power supply 284, the chuck power supply 257, the atmosphere control 204, the backside cooling and heating system 230, the vacuum pump 216, the motor 218, and the manometer 219. A solid drying chemistry removal system 244 is placed below the ESC 208.

Figure 3:
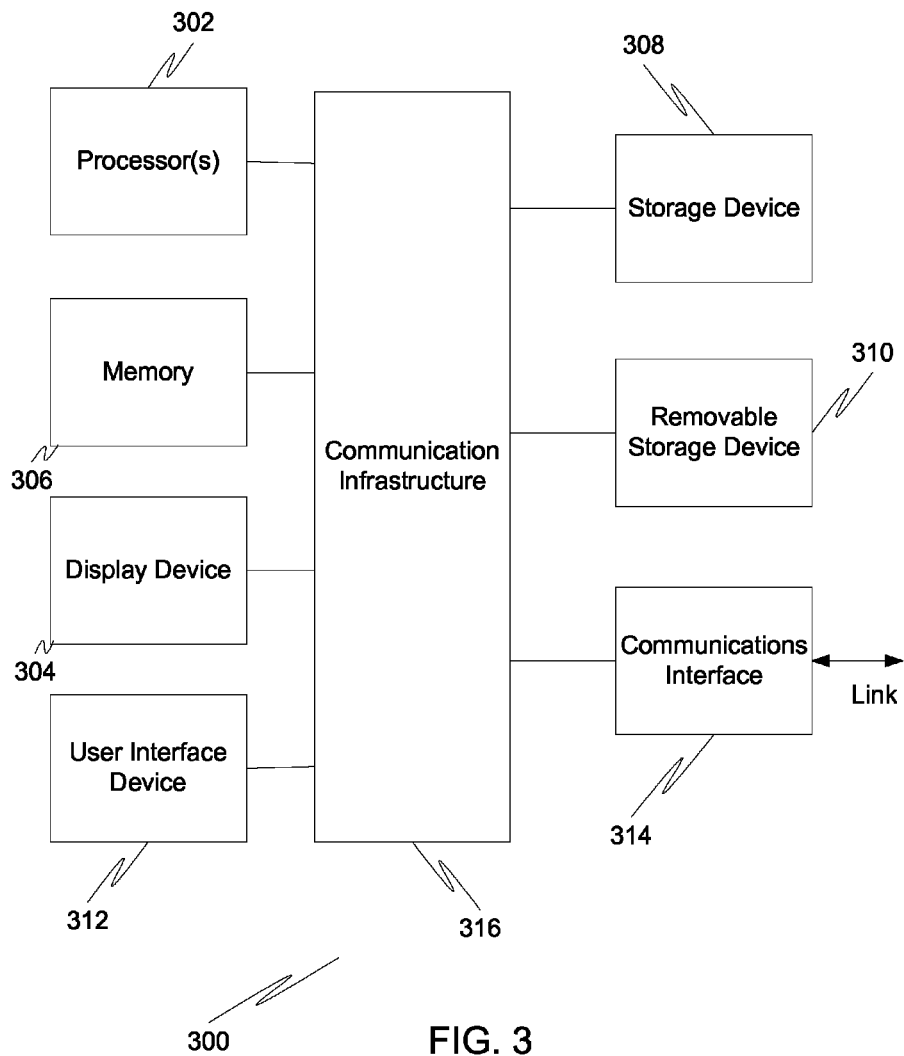
FIG. 3 illustrates a computer system, which is suitable for implementing a controller used in embodiments of the present invention.

FIG. 3 is a high level block diagram showing a computer system 300, which is suitable for implementing a controller 270 used in embodiments of the present invention. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The atmosphere is controlled (step 120). In this example, since the drying chemistry is TBA, the controlled atmosphere is moisture free. In this example, this may be accomplished by flowing a nitrogen gas that is moisture free. It is believed that the moisture free atmosphere improves the delamination drying, since moisture adsorption would depress the freezing point of the drying solution, and evaporating unfrozen liquid would provide capillary forces, which would cause damage. Such a moisture free atmosphere may not be needed if the drying chemistry is not as hygroscopic as TBA.

The wet substrate 206 is transferred through the wet transfer station 232 into the delamination drying chamber 202 at atmospheric pressure (760 Torr) and room temperature, and mounted onto the chuck 208. The wet transfer station 232 would be connected between a wet processing station and the delamination drying chamber 202, and may have a robotic mechanism for transferring a substrate from the wet processing station to the delamination drying chamber 202. After drying, the robotic mechanism in the wet transfer station may be used to remove the substrate from the delamination drying chamber 202 to another chamber. The wet transfer station would be able to handle wet substrates by providing a controlled atmosphere to prevent drying or to prevent other chemical changes to the wet substrate. Some of the liquid drying chemistry may drip from the substrate before or after placing the substrate on the chuck. Grooves 224 in the surface of the chuck allow the wet drying chemistry to flow away from contact surfaces between the chuck and the substrate and prevent pressure build up upon sublimation at reduced chamber pressures.

The drying chemistry is frozen (step 124). In this example, this is accomplished by cooling the chuck to 0° C. using both the thermoelectric devices 217 and the backside cooling and heating system 230. The pressure is maintained at about 1 atmosphere, until the drying chemistry is frozen to form a solid drying chemistry 210. In this example, the freezing was found to take place in 10 seconds. In this example, the frozen drying chemistry is maintained for about 10 seconds.

Figure 2B:
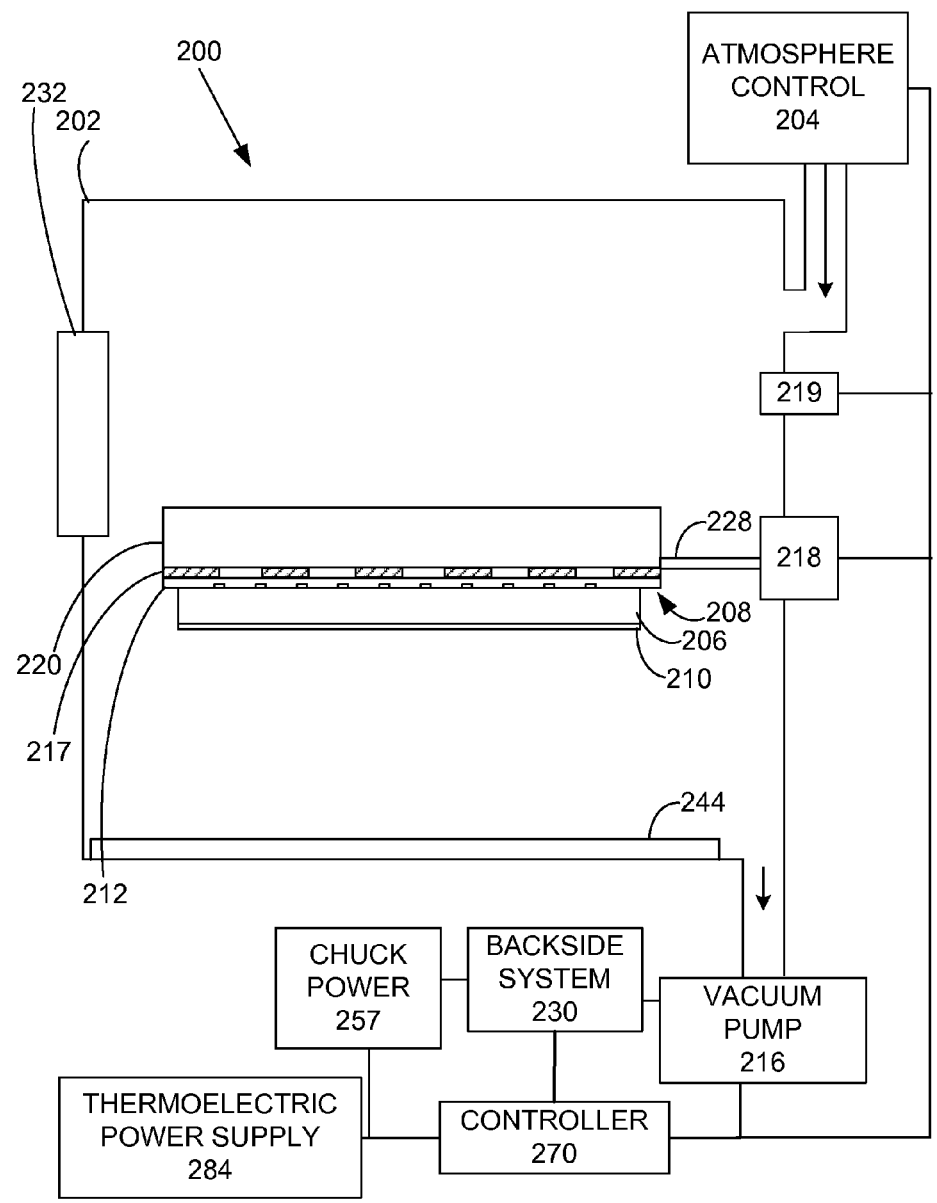
Figure 2C:
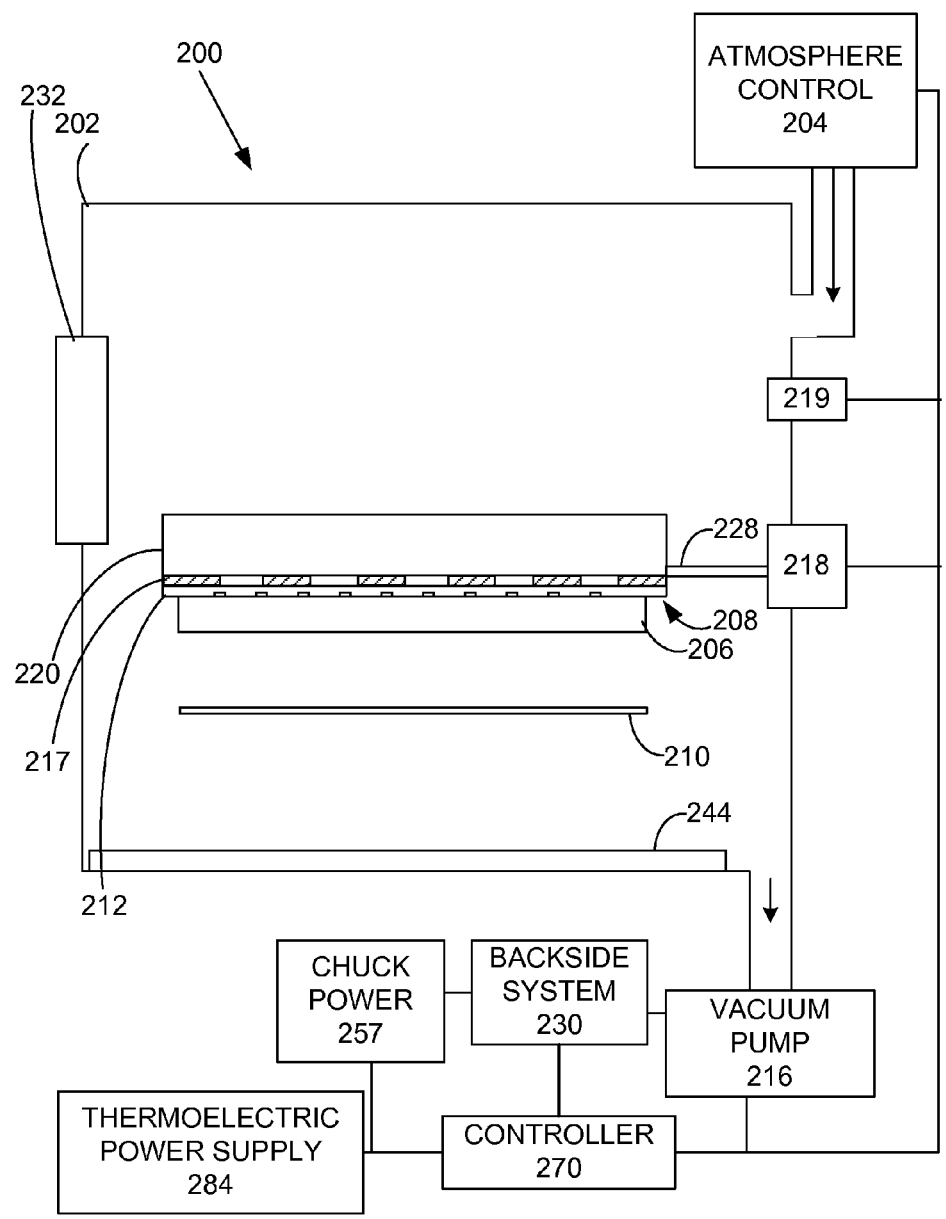

After the drying chemistry is frozen, the solid drying chemistry is delaminated from the substrate (step 128). In this example, the chuck is rotated 180°, so that the substrate 206 goes from being above the chuck 208 to below the chuck 208, as shown in FIG. 2B. In this example, this is accomplished when the controller 270 provides a signal to the motor 218 to rotate the axel 228, which rotates the chuck 208. The pressure is reduced. In this example, a fast pump down is used to pump down the chamber 202 to a pressure between 3 Torr and 0.1 Torr within 25 seconds. The reduction in pressure and the other factors cause the solid drying chemistry 210 to delaminate and fall off of the substrate 206, as shown in FIG. 2C. The solid drying chemistry 210 falls into the solid drying chemistry removal system 244, so that the solid drying chemistry 210 may be removed from the delamination drying chamber 202.

In this example, the chuck 208 is rotated back to the original position, as shown in FIG. 2A, to place the substrate 206 on top. The pressure is increased back to atmospheric pressure with a moisture-free gas, such as dry nitrogen. The chuck temperature is elevated to room temperature. The electrostatic force is removed from the substrate 206 by removing the chucking voltage. The substrate 206 is removed from the delamination drying chamber 202 (step 136).

Alternative Embodiments

Various alternative embodiments of the invention may be provided. In other embodiments of the invention other drying chemistries may be used. Some of the alternative chemistries may be but are not limited to Dimethyl sulfoxide, cyclohexane, acetic acid, carbon tetrachloride, isopropanol, dimethyl carbonate, water and mixtures thereof. In an embodiment using cyclohexane, where the drying chemistry does not comprise water, the controlled atmosphere may have a low humidity. Such drying chemistries may be a pure liquid or a mixture of two or more liquids. In another embodiment, the wet processing liquid may be used as the drying chemistry, so that the wet processing liquid does not need to be displaced by the drying chemistry.

In another embodiment, the displacement of the liquid with the drying chemistry may be performed in the delamination drying chamber. Such processes may spin or may not spin the substrate during the displacement of the liquid with the drying chemistry.

In another embodiment the controlled atmosphere may be any inert gas that contains a low percentage or is free of moisture. Certain inert gases, such as Ar, may have advantages for electrostatically chucking/dechucking the wafers from the ESC.

In another embodiment, the chuck is precooled, before the substrate is placed on the chuck. In another embodiment, a vacuum or mechanical chuck is used instead of an electrostatic chuck. These embodiments may have a slower cooling time and therefore increase processing time, but may provide other advantages. In another embodiment, liquid nitrogen or cold gases may contact the substrate to provide the cool down.

Various different devices may be used to achieve chamber vacuum, such as, a mechanical pump, a cryogenic pump, and/or a turbo molecular pump. An inert gas, such as Ar, He, or $N_2$, may be supplied to the chamber at a controlled flow rate to maintain the desired chamber pressure. In an alternative embodiment, no gas is supplied to maintain desired chamber pressure. Preferably, the chamber pressure is maintained at <5 mTorr. For backside cooling or heating, an inert gas, such as but not limited to He or Ar, is supplied to the backside of the electrostatically chucked wafer at a pressure preferably in the range of 1 Torr-40 Torr in order to provide uniform and efficient heat transfer to the wafer.

In alternative embodiments, the cooling and/or heating of the substrate may be accomplished by a chiller system with one or more chillers or thermoelectric units. Lifting pins may be used to raise the substrate off of the chuck.

In one embodiment after the delamination of the solid drying chemistry is complete, the wafer/ESC may be heated to a temperature near or above the melting temperature of the drying chemistry for a secondary drying.

In various embodiments, during the removal of the substrate, the chamber pressure is increased to 760 Torr by the introduction of an inert gas, such as but not limited to $N_2$, Ar, or He. The wafer is discharged from the ESC and any wafer backside gas flow is shut off. The wafer is then removed from the chamber.

In another embodiment of the invention, a plurality of ESCs with each ESC holding a substrate so that a plurality of substrates is processed at the same time in a single drying chamber. The ESCs may be in a single plane or may be stacked.

It was unexpectedly found that delamination may be used to remove drying chemistry, while reducing collapse of small high aspect ratio structures. Embodiments using delamination allow for solid drying chemistry to be removed, which is faster than sublimation or evaporation. Embodiments that remove solid drying chemistry from the chamber require less energy for sublimation and vapor removal.

Other embodiments may use other methods or apparatuses for removing delaminated solid drying chemistry. A mechanical arm or a shutter or a vacuum system may be used to mechanically remove the delaminated solid drying chemistry. In various experiments, the delamination causes solid drying chemistry to be ejected off of the substrate a distance of inches even when the substrate is above the chuck and the solid drying chemistry is on top of the substrate.

In another embodiment of the invention, high aspect ratio vias are formed in an etch layer. Metal structures are formed in the vias. A wet etch is used to remove the remaining etch layer, leaving the metal structures, which may be used as capacitors. Embodiments of the invention may be used to dry the metal structures to prevent the structures from collapsing.

Other embodiments of the invention may be used to prevent photoresist collapse. Other embodiments of the invention would provide a cleaning process on a wafer that does not have high aspect ratio features.

Various experiments have found embodiments using delamination with less than 1% collapse damage. Various experiments have found that embodiments using delamination have less residues than processes that use evaporation or sublimation. It is believed that the residues are removed in the solid drying chemistry. Various experiments found that embodiments eliminated collapse for structures located at the edge of large feature arrays, a problem that has been observed for sublimation drying. Various experiments have found that the speed of pumping down the chamber to cause delamination does not increase or decrease damage. This allows for fast pump down speeds to provide faster throughput. Various experiments also found that the freeze hold time of the solid drying chemistry does not influence delamination damage, allowing for short hold times and faster throughput. Various experiments did find that increasing drying chemistry volumes require decreasing pressures to allow delamination. These experiments were performed when the solid drying chemistry was on top of the substrate. Therefore, lower volumes of drying chemistries allow for faster delamination, when the solid drying chemistry is on top of the substrate. It is believed that the higher volume of solid drying chemistry creates more weight which may require more pump down to provide a greater force to delaminate a solid drying chemistry of greater weight. If this is correct, then when the substrate is inverted, so that the drying chemistry is below the substrate, then less pump down may be needed to provide delamination of higher volume drying chemistry. Various experiments found that too low of a volume of the drying chemistry may increase collapse. Therefore, some embodiments would use an optimized volume of drying chemistry.

From various experiments, it has been found that for some drying chemistries, the freezing temperature used in delamination would be significantly greater than the freezing temperature used in freeze drying. For example, for delamination drying using tert-butanol as the drying chemistry, the drying chemistry is cooled to about 0° C., whereas for freeze drying, the drying chemistry would be cooled to less than −20° C. Therefore, delamination drying does not require as much of a temperature change, allowing for a faster process and reduced system requirements.

Various embodiments eliminate the need for special bracing of high aspect ratio features, which reduces overall process complexities and costs. These embodiments can be applied to all types of microelectronic topography, whereas bracing is limited to very specific applications.

It is believed that embodiments of the invention provide a thin layer of sublimation between the solid drying chemistry and the substrate. If such sublimation is not uniform, then the delamination may work with features with retrograde surfaces.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for delamination drying a substrate, comprising:
    a chamber for receiving a substrate;
    a chuck for supporting and clamping the substrate within the chamber;
    a temperature controller for controlling the temperature of the substrate, which is able to cool the substrate;
    a vacuum pump in fluid connection with the chamber;
    a tilting mechanism that is able to tilt the chuck at least 90 degrees, wherein the chuck has a first position providing a horizontal surface and a second position, wherein the titling mechanism tilts the horizontal surface to become a vertical surface and tilts the vertical surface to become a horizontal surface; and
    a solid drying chemistry removal system place below the chuck.

2. The apparatus, as recited in claim 1, further comprising an atmosphere control system in fluid connection with the chamber for flowing a controlled atmosphere into the chamber.

3. The apparatus, as recited in claim 2, wherein the atmosphere control comprises a gas source for providing a dry gas into the chamber.

4. The apparatus, as recited in claim 2, wherein the chuck is an electrostatic chuck.

5. The apparatus, as recited in claim 4, further comprising a voltage source for providing a voltage for clamping the substrate to the electrostatic chuck.

6. The apparatus, as recited in claim 4, further comprising a wet transfer station for transferring a substrate with a wet drying chemistry into the chamber and sealing the chamber, wherein the temperature controller is able to cool the substrate to a temperature that freezes the drying chemistry.

7. The apparatus, as recited in claim 1, wherein the chuck comprises grooves.

8. The apparatus, as recited in claim 1, wherein the temperature controller comprises temperature control elements embedded within the chuck.

9. The apparatus, as recited in claim 8, wherein the temperature control elements are able to cool the substrate down to a temperature of at least 0° C. and heat the substrate up to a temperature of at least 20° C.

10. A method, comprising:
    placing a substrate, which is wet with a drying chemistry, on a chuck in a drying chamber;
    freezing the drying chemistry to a solid drying chemistry on the substrate;
    delaminating the solid drying chemistry from the substrate; and
    removing the delaminated solid drying chemistry from the substrate.

11. The method, as recited in claim 10, wherein the delaminating the solid drying chemistry from the substrate, comprises reducing the pressure in the chamber.

12. The method, as recited in claim 11, wherein the freezing the drying chemistry, comprises:
    chucking the substrate to the chuck; and
    using the chuck to back side cool the substrate below the freezing point of the drying chemistry to freeze the drying chemistry.

13. The method, as recited in claim 10, wherein the removing the solid drying chemistry from the substrate, comprises tilting the substrate at least 90°.

14. The method, as recited in claim 13, further comprising:
    forming features on the substrate; and
    wet treating the features on the substrate.

15. The method, as recited in claim 14, wherein the drying chemistry comprises tert-butanol.

16. The method, as recited in claim 10, further comprising removing moisture from an atmosphere in the chamber.

17. The method, as recited in claim 10, further comprising heating the chuck to a temperature above the freezing point of the drying chemistry before placing the substrate on the chuck.

18. The method, as recited in claim 10, further comprising catching liquid drying chemistry that flows from the substrate on the chuck and directing the liquid drying chemistry from points of contact between the substrate and the chuck.

19. The apparatus, as recited in claim 1, wherein the tilting mechanism tilts the chuck with respect to the chamber.

* * * * *